(12) United States Patent
Cowley

(10) Patent No.: US 6,714,263 B2
(45) Date of Patent: Mar. 30, 2004

(54) MULTIPLE CONVERSION TUNER

(75) Inventor: Nicholas Paul Cowley, Wroughton (GB)

(73) Assignee: Zarlink Semiconductor Limited (GB)

( * ) Notice: Subject to any disclaimer, the term of this patent is extended or adjusted under 35 U.S.C. 154(b) by 352 days.

(21) Appl. No.: 09/934,610

(22) Filed: Aug. 22, 2001

(65) Prior Publication Data

US 2002/0122140 A1 Sep. 5, 2002

(30) Foreign Application Priority Data

Aug. 22, 2000 (GB) .............................. 0020528

(51) Int. Cl.[7] ................................................ H04N 5/50
(52) U.S. Cl. ...................... 348/731; 348/733; 455/316; 455/314; 455/315
(58) Field of Search ................................. 348/731, 732, 348/733; 455/313, 314, 315, 316, 260; H04N 5/50

(56) References Cited

U.S. PATENT DOCUMENTS

| | | | |
|---|---|---|---|
| 5,940,143 A | * | 8/1999 | Igarashi et al. ............. 348/678 |
| 6,016,170 A | * | 1/2000 | Takayama et al. .......... 348/731 |
| 6,057,876 A | * | 5/2000 | Waight ....................... 725/151 |
| 6,396,550 B1 | * | 5/2002 | Oh ............................ 348/735 |
| 6,559,899 B1 | * | 5/2003 | Suzuki et al. ............... 348/731 |
| 6,567,654 B1 | * | 5/2003 | Coronel Arredondo et al. . 455/315 |

* cited by examiner

Primary Examiner—Michael H. Lee
Assistant Examiner—Trang U. Tran
(74) Attorney, Agent, or Firm—Thompson Hine LLP

(57) ABSTRACT

A multiple conversion tuner comprises a plurality of cascade-connected frequency changers, each of which comprises a mixer and a local oscillator. The tuner also comprises a local oscillator frequency selecting circuit which controls the frequencies of the local oscillators. The frequencies are controlled so that the final mixer converts a desired signal to the final intermediate frequency and so that the frequency band occupied by the desired signal at the output of each mixer is within the passband of the following intermediate frequency part of the tuner. The local oscillator frequencies are also chosen so that there is no signal at a frequency $F_i$ in the input spectrum to the ith mixer such that:

$$IF_i - \frac{Bw_i}{2} \leq |F_i \pm F_s| \leq IF_i + \frac{Bw_i}{2}$$

where $IF_1$ is the ith intermediate frequency to which the desired signal is converted, $Bw_i$ is the bandwidth of the desired signal at the output of the ith frequency changer and $F_s$ is the frequency of any component signal which may be generated by non-linear mixing of any combination of the signals from the local oscillators.

10 Claims, 3 Drawing Sheets

MULTIPLE CONVERSION TUNER

FIELD OF THE INVENTION

The present invention relates to a multiple conversion tuner. Such a tuner may be used, for example, in receivers for receiving broadcast signals by cable distribution networks or from satellite or terrestrial aerials.

BACKGROUND OF THE INVENTION

Multiple conversion tuners are well known for use in receiving radio signals. Such tuners comprise a plurality of cascade-connected frequency changers, each of which converts the frequency of an input signal to an intermediate frequency. For example, in a typical double conversion tuner, the first frequency changer is an up-converter and converts a frequency band containing a plurality of channels from which it is desired to select an input signal to a higher intermediate frequency. The frequency changer has a local oscillator which is tuned so as to convert a desired channel to the nominal first intermediate frequency and a bandpass filter following the first frequency changer selects the desired channel. The output of the filter is supplied to a second frequency changer of the down-converter type. The second frequency changer has a fixed frequency local oscillator and converts the selected channel to a much lower intermediate frequency. The output of the second frequency changer is filtered by another bandpass filter at the second intermediate frequency and supplied to a demodulator.

In order to prevent interaction between the local oscillators of the frequency changers, it is known for each local oscillator to be housed in a Faraday cage so as to suppress radiation from the local oscillator. Such measures are necessary in order to prevent the radiated local oscillator signals from interfering with other signals within the tuner. However, this physical arrangement prevents a complete multiple conversion tuner from being formed in a single monolithic integrated circuit because such integrated circuits cannot provide the electromagnetic screening which is considered necessary to prevent interference resulting from leakage from the local oscillator signal into other parts of the tuner circuit.

Various attempts have been made to integrate a complete tuner circuit in a minimum number of monolithic integrated circuits with minimum screening, despite the screening problems mentioned hereinbefore. It has been found that such arrangements give rise to a new form of interference which has not previously been described. The basic mechanism comprises beating between two or more local oscillator signals producing a low level signal or "spur" in the output of one or more of the local oscillators. This spur is supplied, together with the desired local oscillator signal, to the corresponding frequency changer. If there happens to be an input signal to the frequency changer at an appropriate frequency, this is converted so as potentially to lie in the desired channel signal after the frequency conversion. The interfering signal is then passed together with the desired signal through the downstream parts of the tuner circuit and appears in the output of the demodulator as a source of interference.

SUMMARY OF THE INVENTION

According to the invention, there is provided a multiple conversion tuner, comprising N cascade-connected frequency changers, where N is an integer greater than one and each ith frequency changer comprises a mixer and a local oscillator, and a local oscillator frequency selecting circuit for selecting the frequencies of at least two of the local oscillators so that:

(i) a desired signal is converted to the Nth intermediate frequency at the output of the Nth frequency changer;
(ii) the frequency band occupied by the desired signal at the output of each ith frequency changer is within the passband of an ith intermediate frequency part of the tuner; and
(iii) there is no signal at a frequency $F_i$ in the input spectrum of the ith mixer such that $$IF_i - \frac{Bw_i}{2} \le |F_i \pm F_s| \le IF_i + \frac{Bw_i}{2}$$

where $IF_i$ is the ith intermediate frequency to which the desired signal is converted, $Bw_i$ is the bandwidth of the desired signal at the output of the ith frequency changer and $F_s$ is the frequency of any component signal which is generatable by non-linear mixing of the N local oscillator signals.

$F_s$ may be expressed as $|A_1 \cdot Flo_1 \pm \ldots A_N \cdot Flo_N|$, where $Flo_i$ is the frequency of the ith local oscillator, $A_i$ is an integer greater than or equal to zero and at least two of these integers are non-zero.

The first frequency changer may be an up-converter.

The first frequency changer may be tuneable for selecting the desired signal. The local oscillator of the or at least one frequency changer subsequent to the first frequency changer may have an output frequency which is shiftable by at least one discrete step.

The tuner may comprise a bandpass filter between the first and second frequency changers.

The selecting circuit may comprise a respective look-up table for each of the at least two local oscillators for converting a channel request signal to a local oscillator frequency controlling signal in accordance with a predetermined function.

The selecting circuit may comprise an interference detector and a tuning control arrangement for varying the frequencies of the at least two local oscillators so as to reduce interference detected by the detector. The tuning control arrangement may be arranged to vary the frequencies so as to minimise the interference. The interference detector may comprise a bit error rate estimator. The interference detector may comprise a circuit for measuring television line frequency energy.

It is thus possible to provide a tuner which can be made without substantial special arrangements for electromagnetically screening the local oscillators from each other. For example, such a tuner may be formed in a single monolithically integrated circuit.

The interference mechanism described hereinbefore can be substantially avoided or the effect thereof reduced to such a level as to permit acceptable performance. In particular, it is possible to select the local oscillator frequencies so that the effect of any spur can be substantially avoided by moving potential spurious mixing products out of band.

BRIEF DESCRIPTION OF THE DRAWINGS

The invention will be further described, by way of example, with reference to the accompanying drawings, in which.

DETAILED DESCRIPTION

Figure 1:
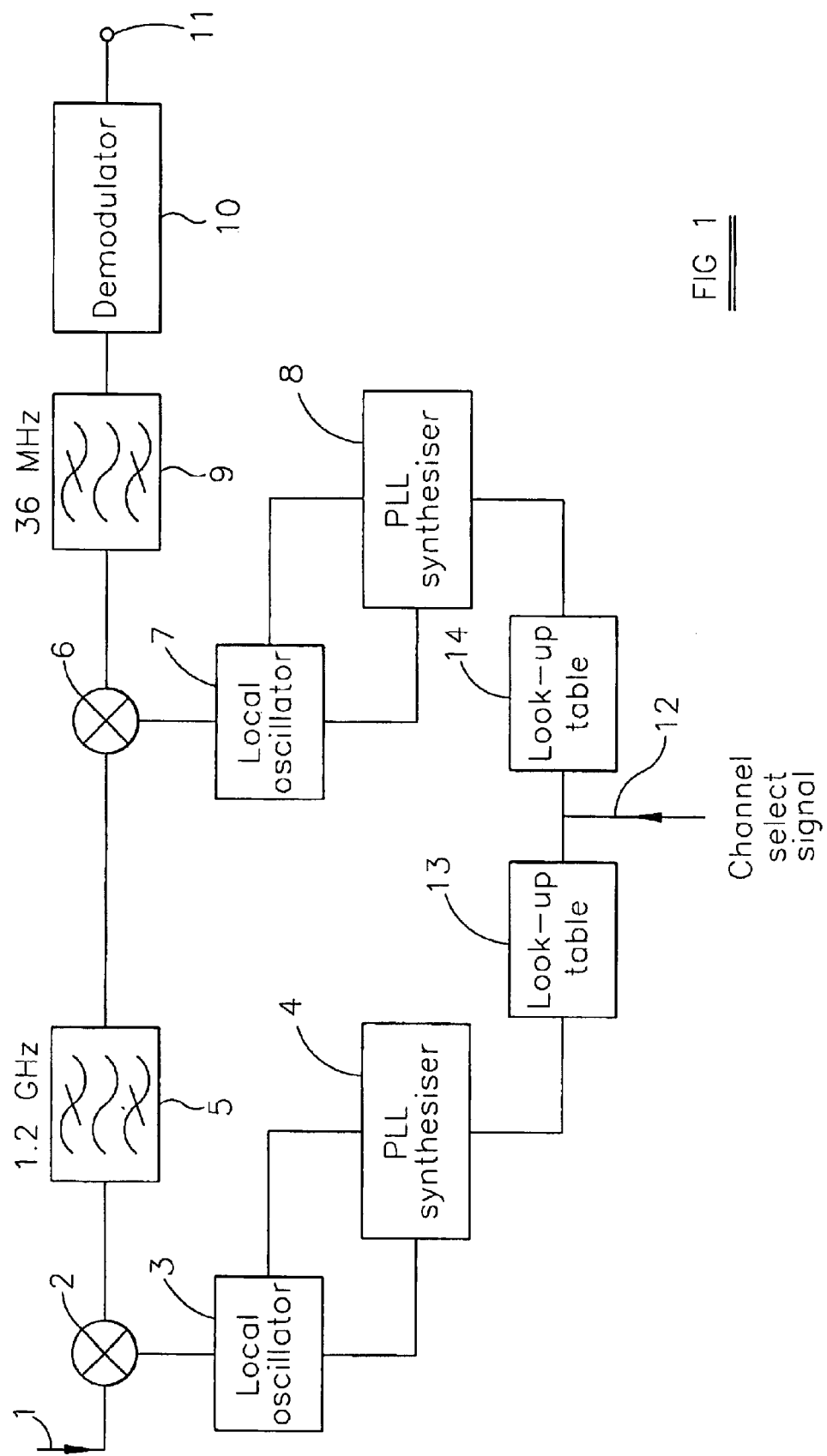
FIG. 1 is a block circuit diagram of a tuner constituting a first embodiment of the invention.

The tuner of FIG. 1 comprises an input 1 which may be connected to receive signals from, for example, a cable distribution network or a terrestrial or satellite aerial. The input 1 is connected to a first mixer 2 of a first frequency changer, whose second input is connected to the output of a local oscillator 3 controlled by a phase locked loop (PLL) synthesiser 4. The local oscillator 3 is tuneable so as to select a desired input channel by converting it to the first intermediate frequency. In particular, the first frequency changer comprising the first mixer 2 and the first local oscillator 3 is arranged to perform up-conversion such that the selected channel is converted to an intermediate frequency which is higher than the frequency of the selected channel. In the tuner illustrated, the first intermediate frequency is 1.2 GHz.

The output of the first mixer 2 is supplied to the input of a bandpass filter 5 having a passband centred at the first intermediate frequency. The output of the filter 5 is supplied to the first input of a second mixer 6 of a second frequency changer. The other input of the mixer 6 is connected to a second local oscillator 7 controlled by a second PLL synthesiser 8. The frequency of the local oscillator 7 is selected to convert the desired channel from the filter 5 to a much lower intermediate frequency illustrated as 36 MHz in the present case. In known double conversion systems of this type, the second local oscillator has a fixed frequency but, in the tuner shown in FIG. 1, the frequency of the second local oscillator 7 is adjustable, for example in a plurality of discrete small steps, under control of the synthesiser 8.

The second frequency changer performs down-conversion to a relatively low intermediate frequency and the output of the second mixer 6 is supplied to a bandpass filter 9 whose passband is centred on the second intermediate frequency. The output of the filter 9 is supplied to a demodulator 10 for demodulating the signal in the desired channel. Alternatively, the output of the filter 9 may be supplied to a third frequency changer. The demodulated signal is supplied to an output 11.

A channel select signal is supplied to a channel select input 12. The channel select signal is, for example, supplied in response to a user selecting a desired channel for reception and is processed by means (not shown) for supplying suitable codes for controlling the local oscillator frequencies by means of the PLL synthesisers 4 and 8. The channel select signal is of the type which defines the nominal frequency of the local oscillator 3 for selecting the desired channel for reception. However, the channel select signal is supplied to look-up tables 13 and 14 which contain functions for defining the actual frequencies of the local oscillators 3 and 7 in order to receive the desired channel and avoid interference caused by spurs resulting from non-linear mixing of the local oscillator signals as a result of signal leakages.

Figure 2:
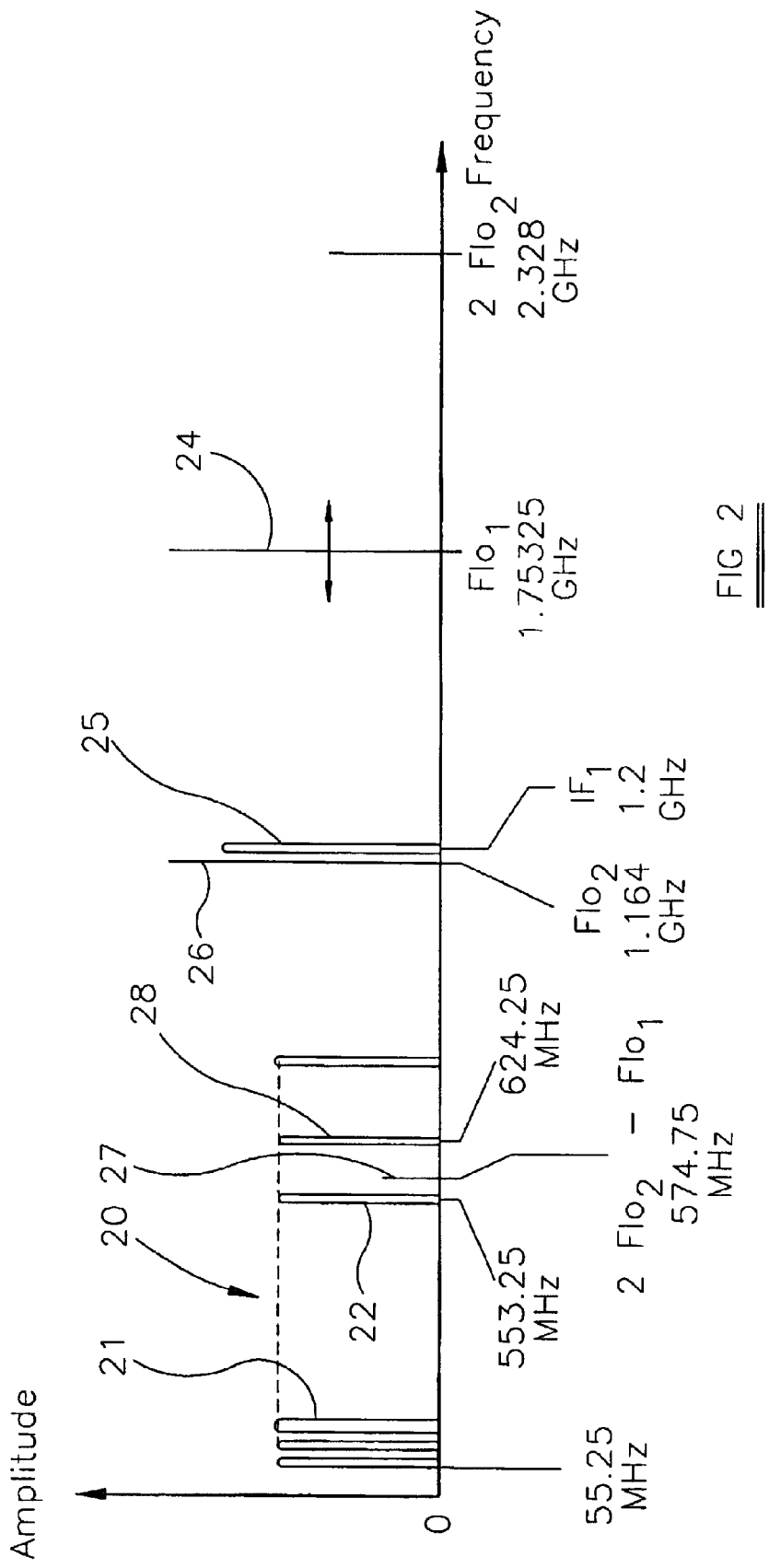
FIG. 2 is a graph of amplitude against frequency illustrating as a frequency spectrum various signals which may occur in the tuner shown in FIG. 1.

FIG. 2 illustrates an example of a typical reception band 20 of a cable distribution network. The individual channels such as 21 have a channel spacing of 6 MHz with the lowest channel being at a frequency of 55.25 MHz. In the illustrated example, it is desired to receive a channel 22 at a frequency of 553.25 MHz so that the frequency 24 of the local oscillator 3 would, in known types of double conversion tuners, be set to 1.75325 GHz so as to convert the channel to the first intermediate frequency 25 of 1.2 GHz. The frequency 26 of the second local oscillator 7 would then conventionally be set to 1.164 GHz so as to provide a second intermediate frequency of 36 MHz.

Because of signal leakages within such a tuner, non-linear mixing of the first and second local oscillator signals 24 and 26 could easily give rise to one or more frequency components in the output of the local oscillator 3 at frequencies equal to $|A_1 \cdot \text{Flo}_1 \pm A_2 \cdot \text{Flo}_2|$, where $\text{Flo}_1$ and $\text{Flo}_2$ are the frequencies of the first and second local oscillators 3 and 7, respectively, and $A_1$ and $A_2$ are arbitrary positive integers greater than zero. For example, a component may exist at $(2.\text{Flo}_2 - \text{Flo}_1)$. The output of the local oscillator 3 would therefore contain a component 27 having a frequency of 574.75 MHz and this would be supplied together with the desired local oscillator signal to the first mixer 2. The first mixer 2 would therefore convert a channel 28 at a frequency of 624.25 MHz to 1.201 GHz and this would appear as an interfering signal in the output of the first mixer 2 together with the desired signal at the first intermediate frequency of 1.2 GHz.

In order to avoid this problem, the function contained in the look-up table 13 converts the channel select signal supplied to the input 12 so that the synthesiser 4 causes the local oscillator 3 to supply an output signal to the mixer 2 having a frequency which is increased above the nominal frequency by 1 MHz. Thus, the local oscillator signal frequency supplied to the first mixer 2 becomes 1.75425 GHz. The function contained in the look-up table 14 causes the synthesiser 8 to reduce the frequency of the output signal of the local oscillator 7 by 1 MHz to a value of 1.163 GHz. The desired channel 22 is shifted by 1 MHz at the output of the first mixer 2 but, because the passband of the filter 5 is sufficiently broad, this desired signal is passed to the second mixer 6 with little or no substantial attenuation. Because the frequency of the local oscillator 7 has been shifted in order to compensate for the change from the nominal first intermediate frequency of the desired channel, the desired channel is converted in the second mixer 6 to the second intermediate frequency and is passed by the filter 9.

Because of the shift in frequency of the first local oscillator 3 compared with the conventionally used frequency in a tuner of this type, the frequency of the channel 28 is converted to 1.203 GHz. The mixer 6 converts this channel to a frequency of 40 MHz so that the resulting signal is substantially attenuated by the filter 9. Also, the frequency of the interfering channel is separated sufficiently from the frequency of the desired channel at the demodulator 10 so that interference between the signals is substantially reduced or eliminated.

The functions contained in the look-up tables 13 and 14 can be determined during development of the tuner since potential interference can be determined on the basis of the nominal local oscillator frequencies for converting each of the channels to the final intermediate frequency.

Figure 3:
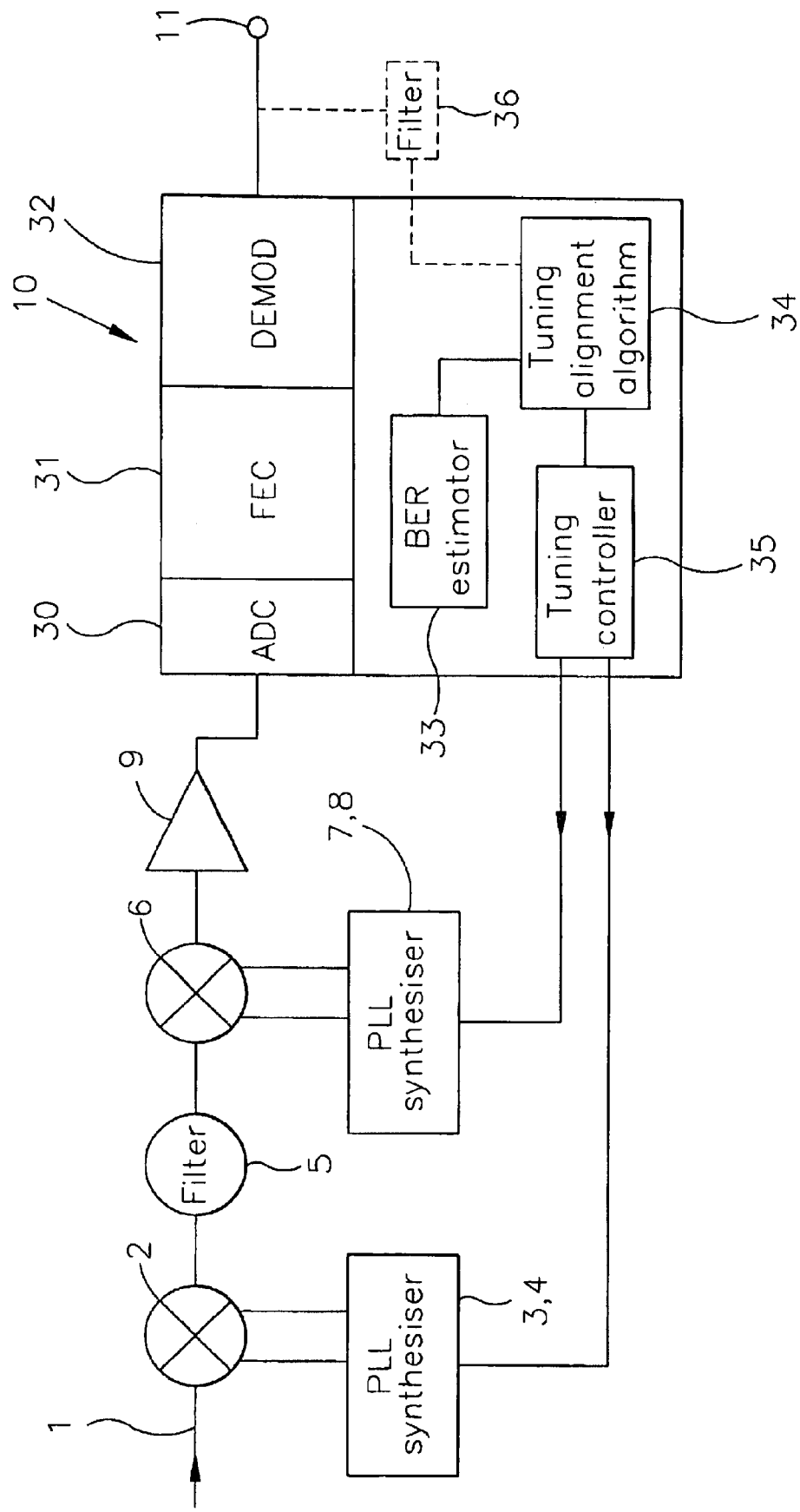
FIG. 3 is a block circuit diagram of a tuner constituting a second embodiment of the invention.

The tuner shown in FIG. 3 differs from that shown in FIG. 1 in that frequency shifting of the local oscillators is controlled dynamically instead of by means of predetermined functions. Thus, the look-up tables 13 and 14 of FIG. 1 are omitted.

The demodulator 10 shown in FIG. 3 comprises an analogue/digital converter (ADC) section 30, a forward error correction (FEC) section 31 and a demodulator (DEMOD) section 32. These sections are of known type and will not be described further.

The demodulator 10 also comprises a bit error rate (BER) estimator 33 which may form part of the FEC section 31.

The estimator 33 supplies an output signal which represents the bit error rate or number of errors in the received channel. Such errors may arise from a number of sources, such as phase noise, intermodulation and the spurious mixing products as described hereinbefore. The output of the estimator 33 is supplied to a tuning alignment algorithm 34 whose output is supplied to a tuning controller 35, which also receives requests for tuning to a desired channel. The algorithm 34 and the controller 35 may, for example, be implemented as part of software controlling the digital domain demodulator 10.

When the tuning controller 35 receives a request for a desired channel, the PLL synthesisers 3, 4 and 7, 8 are controlled to provide the nominal local oscillator signal frequencies for converting the channel to the first intermediate frequency in the mixer 2 and to the second intermediate frequency in the mixer 6. The bit error rate from the estimator 33 is measured and stored. Alternatively, the number of errors per unit time may be averaged over a predetermined period and stored. Such stored values give a measure of the bit error rate for the nominal tuning of the tuner. The tuning alignment algorithm 34 then controls the synthesisers 3, 4 and 7, 8 so as to offset the local oscillator frequencies in the way described hereinbefore such that the desired channel is converted to the second intermediate frequency at the output of the mixer 6 but is converted by the first mixer 2 to a frequency which is shifted from the nominal first intermediate frequency but such that the converted channel remains within the passband of the filter 5.

The new bit error rate determined by the estimator 33 is then compared with the previous stored value to determine what effect the adjustment in local oscillator frequencies has had on the bit error rate and to determine what further adjustments may be required. For example, if the bit error rate has been reduced, the frequency offsetting and bit error rate comparison may be repeated with further local oscillator frequency offsets in the same direction unless and until a minimum bit error rate is found. If the bit error rate increases, the direction of the frequency offsets of the first and second local oscillators may be changed and the process repeated until a minimum bit error rate is achieved.

The local oscillator frequency offsets may be of a fixed amount. However, it is also possible to perform "alignment" initially at a relatively coarse frequency offset and, when bit error rate has been minimised, to repeat the procedure with smaller frequency offsets until the optimum local oscillator offsets have been determined.

As an alternative or addition to controlling the local oscillator offsets on the basis of estimated bit error rates, a bandpass filter arrangement 36 may have its input connected to the output 11 of the demodulator and its output connected to the tuning alignment algorithm 34 so as to control alignment on the basis of the measured level of energy at a television signal line rate, which is typically 15.75 kHz in a known type of television system. When the interfering signal is from an analogue channel, large amounts of energy are produced at the line rate and the filter arrangement 36 is tuned so as to detect this energy. The tuning alignment algorithm 34 then controls the local oscillator offsets so as to minimise this energy instead of or in addition to minimising the bit error rate.

By the use of this technique, spurs can be shifted such that potentially interfering channels are moved to frequencies which do not cause any substantial interference with the desired channel within the tuner. It is not therefore necessary to provide electromagnetic screening of the local oscillators so that a multiple conversion tuner may be integrated in a single monolithic integrated circuit.

What is claimed is:

1. A multiple conversion tuner, comprising: N cascade-connected frequency changers, each having an output, where N is an integer greater than one and each ith one of said frequency changers comprises a mixer and a local oscillator, where $0<i\leq N$; N intermediate frequency parts each having a passband; and a local oscillator frequency selecting circuit for selecting frequencies of oscillation of at least two of said local oscillators so that:

(i) a desired signal is converted to an Nth intermediate frequency at said output of an Nth of said frequency changers;

(ii) a frequency band occupied by said desired signal at said output of each jth one of said frequency changers is within said passband of each jth one of said intermediate frequency parts of said tuner; and (iii) there is no signal at a frequency $F_i$ in an input spectrum of said mixer of each ith one of said frequency changers such that:

$$IF_i - \frac{Bw_i}{2} \leq |F_i \pm F_s| \leq IF_i + \frac{Bw_i}{2}$$

where $IF_i$ is an ith intermediate frequency to which said desired signal is converted, $Bw_i$ is a bandwidth of said desired signal at said output of each ith one of said frequency changers and $F_s$ is a frequency of any component signal which is generatable by non-linear mixing of any combination of output signals of said local oscillators of said N frequency changers.

2. A tuner as claimed in claim 1, in which a first of said frequency changers is an up-converter.

3. A tuner as claimed in claim 1, in which a first of said frequency changers is tuneable for selecting said desired signal.

4. A tuner as claimed in claim 3, in which said local oscillator of at least one said frequency changer subsequent to said first frequency changer has an output frequency which is shiftable by at least one discrete step.

5. A tuner as claimed in claim 1, comprising a bandpass filter between said first and second frequency changers.

6. A tuner as claimed in claim 1, in which said selecting circuit comprising a respective look-up table for each of said at least two local oscillators for converting a channel request signal to a local oscillator frequency controlling signal in accordance with a predetermined function.

7. A tuner as claimed in claim 1, in which said selecting circuit comprises an interference detector and a tuning control arrangement for varying said frequencies of said at least two local oscillators so as to reduce interference detected by said detector.

8. A tuner as claimed in claim 7, in which said tuning control arrangement is arranged to vary said frequencies so as to minimise interference.

9. A tuner as claimed in claim 7, in which said interference detector comprises a bit error rate estimator.

10. A tuner as claimed in 7, in which said interference detector comprises a circuit for measuring television line frequency energy.

* * * * *

UNITED STATES PATENT AND TRADEMARK OFFICE
CERTIFICATE OF CORRECTION

PATENT NO. : 6,714,263 B2
DATED : March 30, 2004
INVENTOR(S) : Nicholas Paul Cowley It is certified that error appears in the above-identified patent and that said Letters Patent is hereby corrected as shown below:

<u>Column 6,</u>
Line 9, remove the extra line under the symbol "≤".
Line 59, change the word "minimise" to -- minimize --.
Line 62, insert -- claim -- before "7".

Signed and Sealed this

Twenty-ninth Day of June, 2004

JON W. DUDAS
*Acting Director of the United States Patent and Trademark Office*